(12) United States Patent
Maddux et al.

(10) Patent No.: US 8,253,440 B2
(45) Date of Patent: Aug. 28, 2012

(54) METHODS AND SYSTEMS TO CALIBRATE PUSH-PULL DRIVERS

(75) Inventors: John Maddux, Folsom, CA (US); Luke A. Johnson, Queen Creek, AZ (US); Ronald W. Swartz, Granite Bay, CA (US); Donald Rush, El Dorado Hills, CA (US); Meetul Goyal, El Dorado Hills, CA (US); Rajashri Doddamani, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/565,545

(22) Filed: Sep. 23, 2009

(65) Prior Publication Data

US 2011/0050280 A1 Mar. 3, 2011

Related U.S. Application Data

(60) Provisional application No. 61/238,412, filed on Aug. 31, 2009.

(51) Int. Cl.
*H03K 19/003* (2006.01)
(52) U.S. Cl. .......................................... 326/30; 326/31
(58) Field of Classification Search .................... 326/30, 326/21, 26
See application file for complete search history.

(56) References Cited

U.S. PATENT DOCUMENTS

| | | | |
|---|---|---|---|
| 6,040,708 A | 3/2000 | Blake et al. | |
| 6,570,401 B2 | 5/2003 | Correale, Jr. et al. | |
| 6,924,660 B2 * | 8/2005 | Nguyen et al. | 326/30 |
| 6,980,020 B2 * | 12/2005 | Best et al. | 326/30 |
| 7,038,486 B2 * | 5/2006 | Aoyama et al. | 326/30 |
| 7,656,186 B2 * | 2/2010 | Osanai et al. | 326/30 |
| 7,746,096 B1 * | 6/2010 | Yang | 326/30 |
| 7,869,973 B2 * | 1/2011 | Yoko et al. | 702/107 |

* cited by examiner

*Primary Examiner* — James H Cho
(74) *Attorney, Agent, or Firm* — Garrett IP, LLC (57) ABSTRACT

Methods and systems to calibrate an on-die resistor relative to an operating voltage of an on-die push-pull driver, and to calibrate the push-pull driver relative to the on-die resistor and relative to operating voltages of the push-pull driver. The calibrated on-die resistor may be used to calibrate receive terminations, a differential transmit termination, and a simulated far-end differential receive termination. The calibrated differential transmit termination and simulated far-end differential receive termination may be coupled in parallel to calibrate current drivers. Calibration of the current drivers may include calibrating voltage swing, and may include a first phase that simultaneously adjusts compensation to the current drivers, and a second phase that individually adjusts the compensation to the current drivers.

18 Claims, 7 Drawing Sheets

METHODS AND SYSTEMS TO CALIBRATE PUSH-PULL DRIVERS

CROSS-REFERENCE TO RELATED APPLICATIONS

This application claims the benefit of U.S. Provisional Patent Application No. 61/238,412, titled "Methods and Systems to Calibrate Push-Pull Drivers," filed on Aug. 31, 2009, which is incorporated herein by reference in its entirety.

BACKGROUND

Calibration of a push-pull driver is conventionally performed relative to an external or off-die resistor. Process, voltage and temperature (PVT) variation differences between the push-pull driver die and the off-die resistor may, however, lead to errors.

Calibration of a push-pull driver is conventionally performed at voltages that differ from normal operating voltages, which may also lead to errors.

Driver circuits are conventionally calibrated individually and single-ended. Individual and singled-ended calibration of the driver currents may, however, lead to errors when the driver circuits are used differentially during operation.

Driver currents are conventionally calibrated first and the calibrated driver currents are used to calibrate transmit terminations. Errors in calibration of the driver currents may lead to errors in calibration of the termination circuits.

Errors may be exacerbated at smaller scale integrated circuit fabrication technologies.

Errors may be overcome with additional design features, but at a cost of added area and power consumption.

In the drawings, the leftmost digit(s) of a reference number identifies the drawing in which the reference number first appears.

DETAILED DESCRIPTION

Disclosed herein are methods and systems to calibrate a push-pull driver, including to calibrate an on-die resistor and to use the calibrated on-die resistor to calibrate the push-pull driver. Portions of the push-pull driver may be calibrated relative to voltage levels encountered during normal operation of the push-pull driver.

Figure 1:
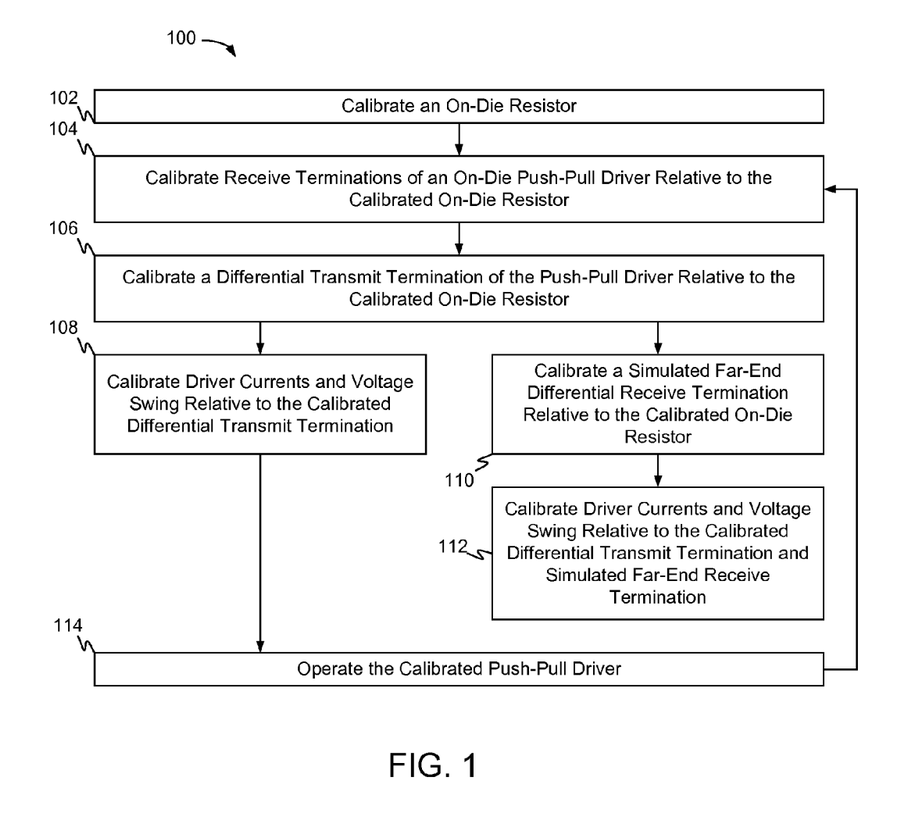
FIG. 1 is a process flowchart of an exemplary method of calibrating a push-pull driver.

FIG. 1 is a process flowchart of an exemplary method 100 of calibrating a push-pull driver.

At 102, on-die resistor is calibrated. The on-die resistor may be calibrated relative to another resistor, which may include an off-die resistor.

The on-die resistor may include a relatively high precision on die resistor, which may include a plurality of parallel selectable resistor legs, and calibration at 102 may include determining a compensation code value to selectively enable one or more of the resistor legs. The on-die resistor may be configured in a binary fashion, and calibration at 102 may include determining a binary compensation code value to selectively enable one or more of the resistor legs.

Calibration of the on-die resistor may include coupling the on-die resistor in series with the off-die resistor, and may include calibrating the on-die resistor to have a resistance equal to a resistance of the off-die resistor. Calibration of the on-die resistor may be performed at a voltage within an operating voltage of the push-pull driver, referred to herein as $V_{CC}$. Calibration of the on-die resistor may be performed, for example, with a voltage of approximately $(V_{CC}-V_{CC}/2)$ applied across the on-die resistor.

The calibrated on-die resistor may used to calibrate transmit and receive terminations of the push-pull driver, such as described below with respect to one or more of 104, 106, and 110.

At 104, receive terminations may be calibrated relative to the calibrated on-die resistor. The receive terminations may include a plurality of parallel selectable resistor legs, such as described above with respect to 102.

Calibration of the receive termination at 104 may be performed with respect to the on-die resistor and another resistor, such as an off-die resistor. For example, the receive terminations and the off-die resistor may be coupled in parallel with one another, and the parallel combination may be coupled in series with the calibrated on-die resistor. The receive terminations may be calibrated to have resistances of the on-die resistor.

Calibration of the receive terminations at 104 may be performed at a voltage level that is encountered during normal operation, which may reduce or eliminate voltage dependent switch resistance variations amongst termination lanes.

At 106, a differential transmit termination may be calibrated relative to the calibrated on-die resistor.

The differential transmit termination may include a plurality of parallel selectable differential resistor legs, which may be configured as described above with respect to 102.

Calibration of the differential transmit termination at 106 may be performed with respect to the on-die resistor and another resistor, such as an off-die resistor. For example, the differential transmit termination may be coupled between the calibrated on-die resistor and the off-die resistor. The differential transmit termination may be calibrated to have a resistance of, for example, approximately 110 ohms.

Calibration of the differential transmit termination at 106 may be performed at a voltage level that is encountered during normal operation, which may reduce or eliminate voltage dependent switch resistance variations amongst the termination lanes.

At 108, driver currents and voltage swing may be calibrated relative to the calibrated differential transmit termination.

A transmit eye height, corresponding to a voltage swing, may be determined as a current through drivers of a push-pull driver, multiplied by a transmit termination resistance in parallel with a far end receive termination.

To account for far-end receive termination, a simulated far-end receive termination may be calibrated at 110, which may be performed similar to calibration of the differential transmit termination at 106 and, at 112, driver current and voltage swing may be calibrated with respect to the calibrated transmit termination and the calibrated simulated far-end receive termination. Calibration at 112 may be performed with the differential transmit termination and the simulated differential receive termination in parallel to one another, to simulate an operating environment of the push-pull driver.

Calibration at 108 and/or 112 may be performed without reference to an external or off-die resistor, which may reduce or eliminate mismatches between on-die resistors and an external resistor.

Driver current and swing voltage may be calibrated in combination with one another, which may include a differential calibration. Calibration of driver current and swing voltage in combination with one anther may simulate an operating environment of the push-pull driver, and may reduce or eliminate errors that might otherwise occur due to differences between a dummy driver circuit and actual lane driver circuits.

Calibration at 108 and/or 112 may include calibrating driver current compensation for NMOS and PMOS drivers together, during one or more compensation cycles, which may reduce the number of cycles needed to perform the calibration, and which may provide a relatively accurate differential voltage swing.

Calibration and compensation of NMOS and PMOS drivers may include a relatively coarse calibration, such as illustrated in Table 1 below, and may include a subsequent relatively finer tuning calibration, such as illustrated in Table 2 below.

TABLE 1

| CONDITION | PMOS Current Adjustment | NMOS Current Adjustment |
| --- | --- | --- |
| VCM is Low | Increment | Decrement |
| V Swing is Low | Increment | Increment |
| V Swing is High | Decrement | Decrement |
| VCM is High | Decrement | Increment |

TABLE 2

| CONDITION | PMOS Current Adjustment | NMOS Current Adjustment |
| --- | --- | --- |
| VCM is Low | Increment | No Change |
| V Swing is Low | No Change | Increment |
| V Swing is High | No Change | Decrement |
| VCM is High | Decrement | No Change |

At 114, the calibrated push-pull driver is placed into operation, after which, one or more portions of the push-pull driver may be re-calibrated relative to the on-die resistor. Where a process, voltage, and/or temperature variation leads to changes in a resistance of the on-die resistor, such changes may correspond to changes in other on-die resistances of the push-pull driver, which may help to reduce errors.

Method 100 may be performed with respect to multiple lanes of one or more I/O circuits.

Figure 2:
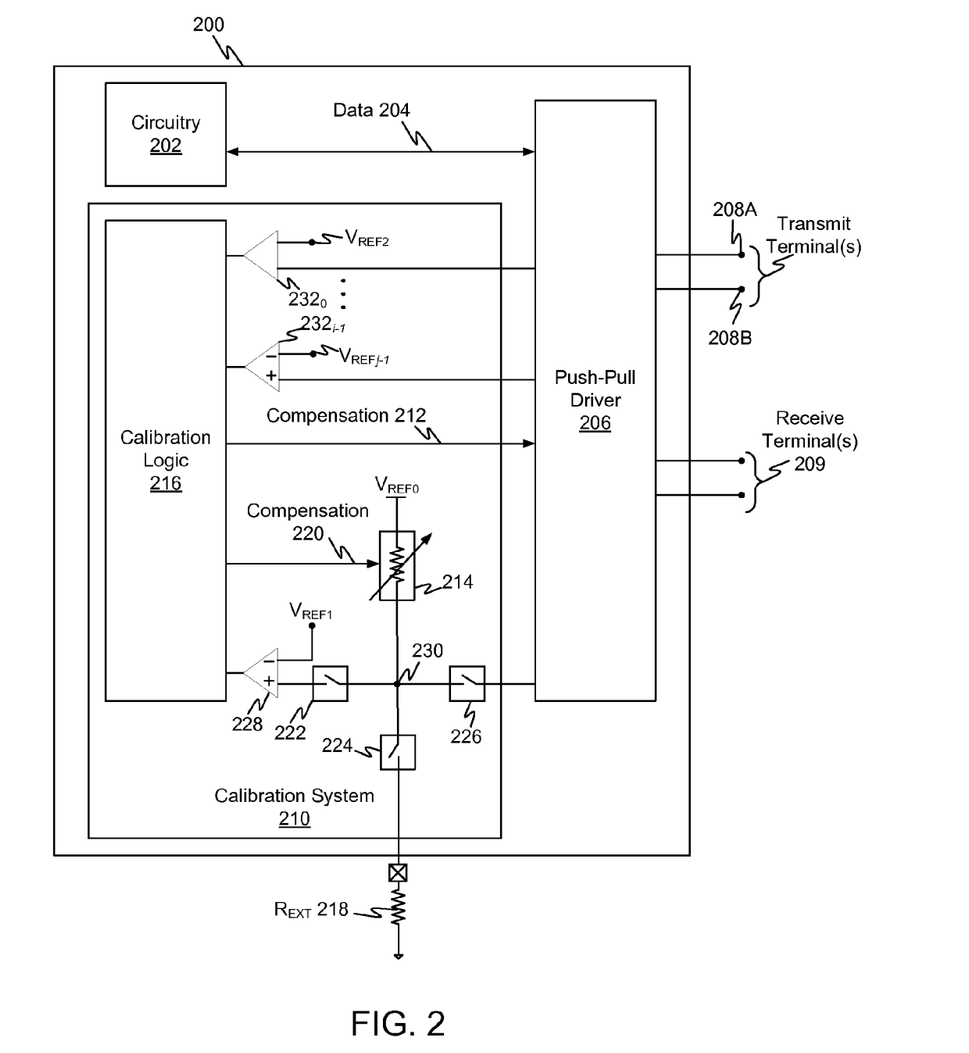
FIG. 2 is a block diagram of an exemplary system including a push-pull driver, a calibration system, and an adjustable resistor on-die with the push-pull driver.

FIG. 2 is a block diagram of an exemplary system 200 including circuitry 202 to generate data 204, a push-pull driver 206 to transmit data 204 via output terminals or pads 208, and a calibration system 210 to calibrate and provide compensation 212 to push-pull driver 206.

Calibration system 210 may be configured to calibrate push-pull driver 206 to maintain transmit voltage eye height specifications over process, voltage and/or temperature variations, and may be configured to adjust one or more transmit current sources and termination resistances.

Calibration system 210 may be configured to calibrate push-pull driver 206 upon system start-up and may be configured to calibrate push-pull driver 206, or portions thereof, subsequent to start-up, such as between transmissions, intermittently and/or periodically.

Calibration system 210 includes an adjustable calibration resistor 214. Resistor 214 and push-pull driver 206, or a portion thereof, are fabricated on the same substrate, which may include an integrated circuit die or chip. Resistor 214 is also referred to herein as on-die resistor 214. One or more other features of calibration system 210 may be implemented on-die or off-die relative to push-pull driver 206.

Calibration system 210 includes calibration logic 216 to calibrate on-die resistor 214 relative to one or more other resistors, which may include an off-die or external resistor $R_{EXT}$ 218. Calibration logic 216 may be further configured to calibrate on-die resistor 214 relative to one or more reference voltages, illustrated here as $V_{REF0}$ and $V_{REF1}$.

Calibration system 210 may include switch logic, illustrated in FIG. 2 as including switches 222, 224, and 226 to selectively couple resistor 214 to one or more of external resistor $R_{EXT}$ 218, calibration logic 216, and push-pull driver 206.

To calibrate resistor 214, calibration system 210 may be configured to close switches 222 and 224, open switch 226, and apply reference voltage $V_{REF0}$ to on-die resistor 214. Calibration system 210 may include a comparator 228 to compare a voltage at a node 230 to reference voltage $V_{REF1}$.

Calibration system 210 is configured to adjust compensation 220 to on-die resistor 214 until the voltage at node 230 is substantially equal to reference voltage $V_{REF1}$. Reference voltage $V_{REF0}$ may be, for example, a system voltage, referred to herein as $V_{CC}$, and reference voltage $V_{REF1}$ may be a fraction of $V_{REF0}$, such as, for example, $V_{CC}/2$. In such a situation, calibration logic 216 may be configured adjust compensation 220 until a value of on-die resistor 214 is substantially equal to a value of external resistor $R_{EXT}$ 218, while a voltage of $(V_{REF0}-V_{REF1})$ is applied across on-die resistor 214. The voltage $(V_{REF0}-V_{REF1})$ may be selected within an operating voltage range of push-pull driver 206. External resistor $R_{EXT}$ 218 may be, for example, approximately 50 ohms.

Calibration system 210 may include one or more additional comparators, illustrated in FIG. 2 as comparators $232_0$ through $232_{i-1}$, to receive one or more reference voltages, illustrated here as $V_{REF2}$ through $V_{REFj-1}$, and to receive one or more signals from push-pull driver 206. Calibration logic 216 may include logic to provide compensation 212 to push-pull driver 206 in response to outputs of comparators $232_0$ through $232_{i-1}$. Calibration system 210 may include one or more additional switches to utilize calibrated on-die resistor 214 to calibrate push-pull driver 206.

Figure 3:
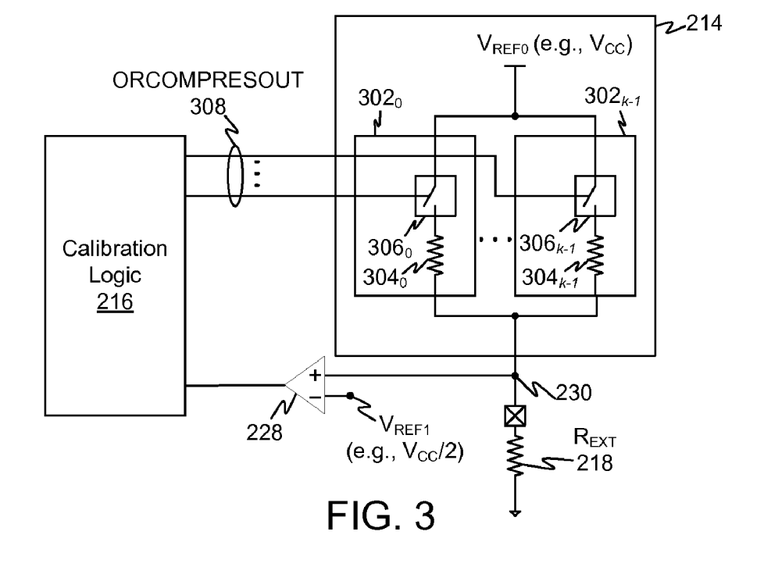
FIG. 3 is an exemplary circuit diagram of the adjustable on-die resistor, including a plurality of parallel resistor legs, each including a resistor and a corresponding switch.

FIG. 3 is an exemplary circuit diagram of on-die resistor 214, including a plurality of parallel resistor legs 302, each including a resistor 304 and a corresponding switch 306.

In the example of FIG. 3, on-die resistor 214 is in series with external resistor $R_{EXT}$ 218, to be calibrated by calibration logic 216. Calibration logic 216 may be configured to adjust a compensation code 308, illustrated here as ORCOMPRESOUT, to selectively open and close switches 306 until the voltage at node 230 is substantially equal to $V_{REF1}$. Compensation code 308 may be implemented, for example, as a 7-bit code. Compensation code 308 may correspond to compensation 220 in FIG. 2.

Resistors 304 may be implemented in a binary fashion, wherein a value of a resistor $304_1$ is twice the value of a preceding resistor $304_0$, a value of a resistor $304_2$ is twice the value of a preceding resistor $304_1$, and a value of a resistor $304_{k-1}$ is twice the value of a preceding resistor $304_{k-2}$. Compensation code 308 may be implemented as a binary code.

Figure 4:
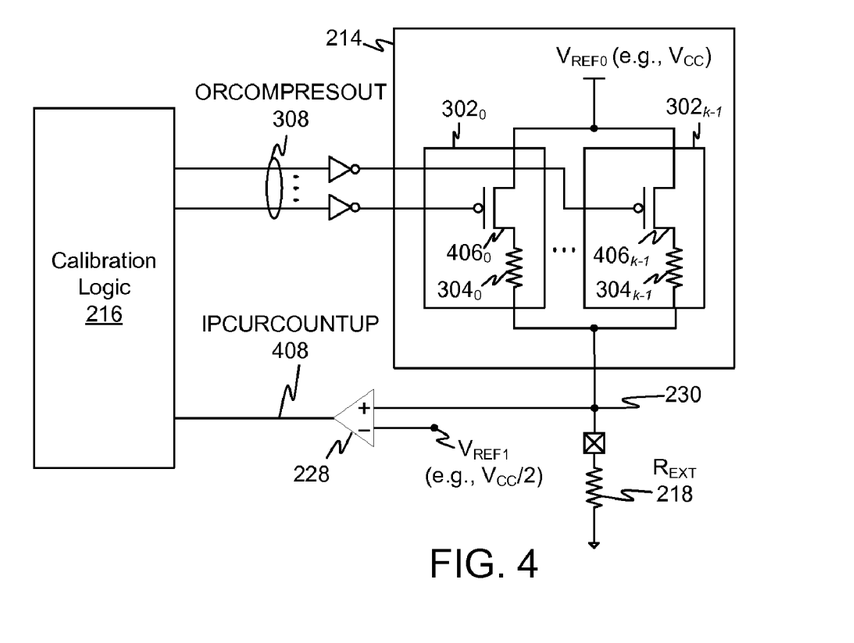
FIG. 4 is another exemplary circuit diagram of the adjustable on-die calibration resistor, wherein the switches are illustrated as PMOS devices.

FIG. 4 is another exemplary circuit diagram of on-die resistor 214, wherein switches 306 of FIG. 3 are illustrated as PMOS devices 406, and an output of comparator 228 is illustrated as IPCURCOUNTUP 408.

Figure 5:
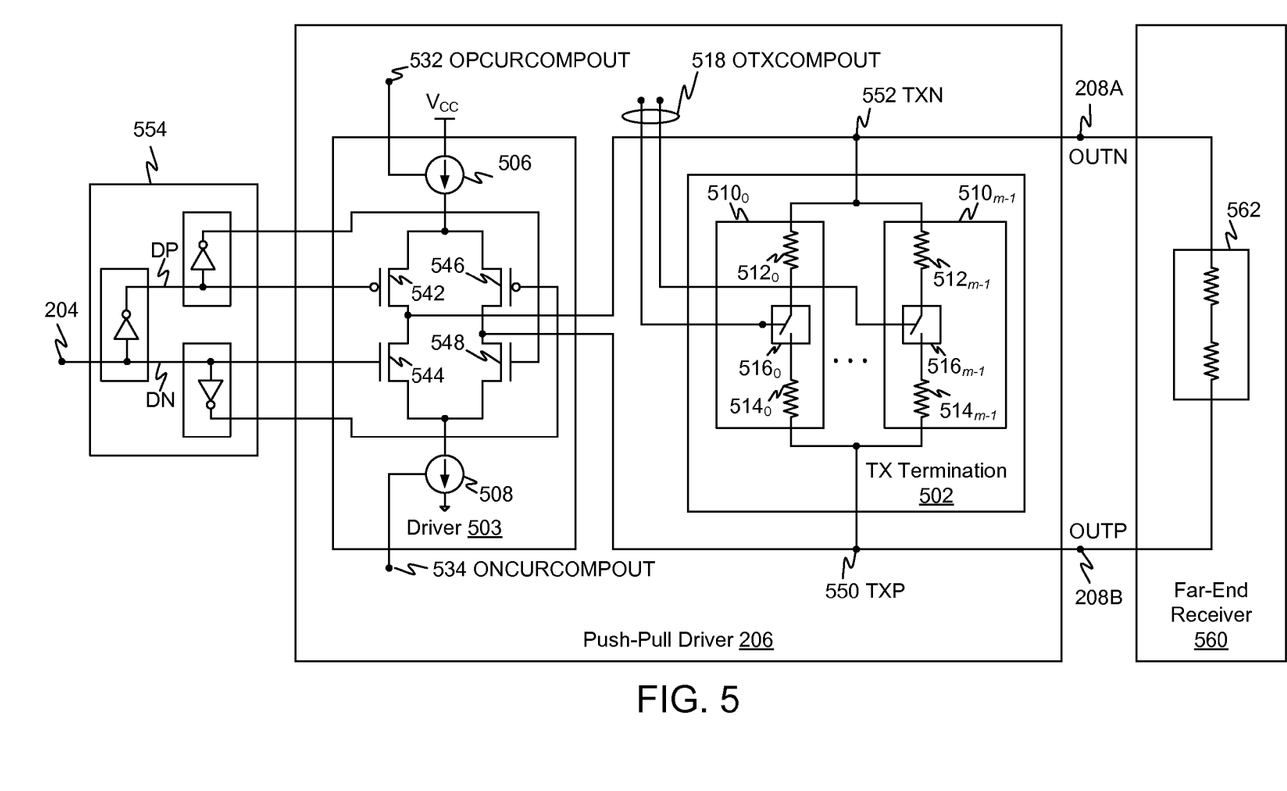
FIG. 5 is an exemplary circuit diagram of the push-pull driver, including a transmit termination, receive terminations, and current drivers.

FIG. 5 is an exemplary circuit diagram of a portion of push-pull driver 206, to illustrate exemplary configurations and operation of calibration system 210. Push-pull driver 206 is not, however, limited to the example of FIG. 5.

In FIG. 5, push-pull driver 206 includes a differential driver 503 to receive differential data DP and DN, which may correspond to data 204 in FIG. 1, and to differentially drive differential data DP and DN at differential terminals 208A and 208B.

Differential driver 503 may include a PMOS current driver 506, an NMOS current driver 508, and current steering circuitry, illustrated here as PMOS devices 542 and 546, and NMOS devices 544 and 548, to steer current through a differential transmit termination 502.

One or more of push-pull driver 206 and circuitry 202 in FIG. 2 may include circuitry, functionally illustrated here as logic 554, to control devices 542 through 548 in response to data 204 and/or differential data DP and DN.

During normal operation, as DP falls and DN rises, PMOS device 542 and NMOS device 548 turn on, and PMOS device 546 and NMOS device 544 turn off. In response, current from PMOS device 542 is steered through differential transmit termination 502 in a direction from a node 552 to a node 550, and through NMOS device 548.

Conversely, as DP rises and DN falls, PMOS device 542 and NMOS device 548 turn off, and PMOS device 546 and NMOS device 544 turn on. In response, current from PMOS device 546 is steered through differential transmit termination 502 in a direction from node 550 to node 552, and through NMOS device 544.

A voltage drop across differential transmit termination 502, and swing voltages at nodes 550 and 552, depend upon a resistance of differential transmit termination 502 and currents provided by PMOS current driver 506 and NMOS current driver 508.

Calibration of push-pull driver 206 may include calibrating differential transmit termination 502 and current drivers 506 and 508.

Figure 6:
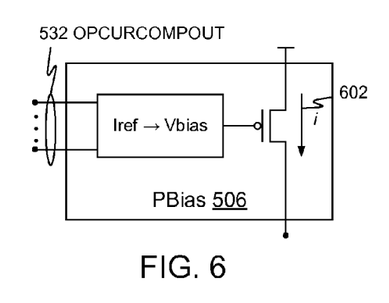
FIG. 6 is a circuit diagram of an exemplary P-type current driver.
Figure 7:
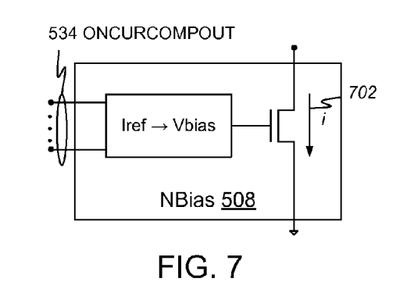
FIG. 7 is a circuit diagram of an exemplary N-type current driver.

FIG. 6 is an exemplary circuit diagram of PMOS current driver 506 to vary a current 602 in response to a current compensation code 532. FIG. 7 is an exemplary circuit diagram of NMOS current driver 508 to vary a current 702 in response to a current compensation code 534. Current compensation codes 532 and 534 may be implemented, for example, as 7-bit codes.

Referring back to FIG. 5, differential transmit termination 502 may include a plurality of parallel resistor legs 510, each including differential resistors 512 and 514 and a switch 516 therebetween. Switches 516 may be controlled by a transmit termination compensation code 518, illustrated here as OTXCOMPOUT. Transmit termination compensation code 518 may be implemented, for example, as a 5-bit code.

Resistor legs 510 may be configured in a binary fashion, such as described above with respect to FIG. 3, and compensation code 518 may be a binary code.

Compensation codes 518, 532, and 534 may correspond to compensation 212 in FIG. 2.

Push-pull driver 206 may be configured to be coupled to a far-end receiver 560, which may include a receive termination 562.

Calibration system 210 may be configured to use calibrated on-die resistor 214 to calibrate one or more of transmit termination 502, receive terminations, and a simulated far-end receive termination corresponding to far-end receive termination 562.

Calibration system 210 may be configured to use one or more of calibrated transmit termination 502 and the calibrated simulated far-end receive termination to calibrate current drivers 506 and 508.

Figure 8:
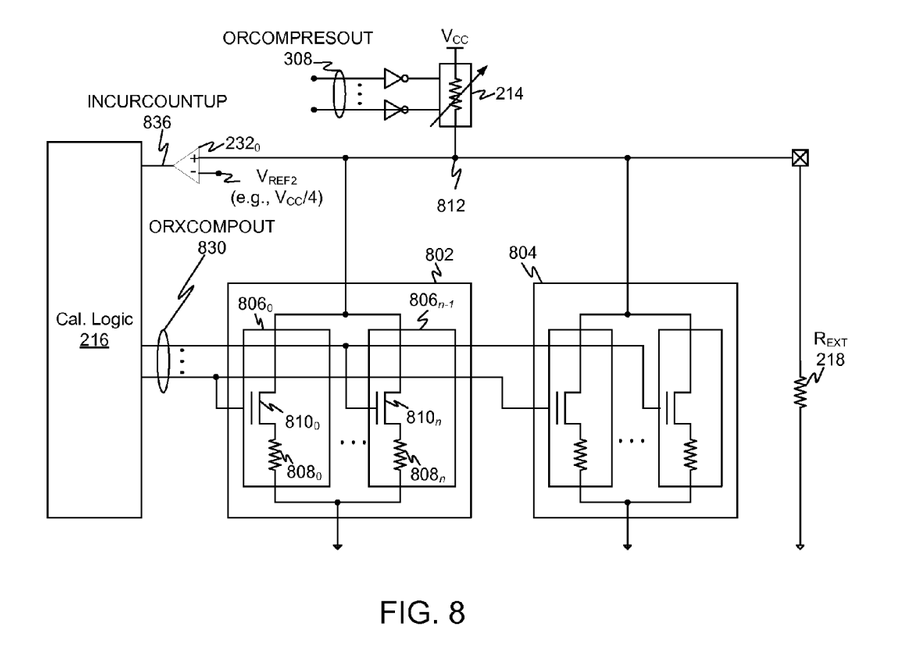
FIG. 8 is an exemplary circuit diagram of the receive terminations and portions of the calibration system to calibrate the receive terminations relative to the adjustable on-die resistor.

FIG. 8 is a circuit diagram of exemplary receive terminations 802 and 804, and portions of calibration system 200 to determine a receive termination compensation code 830, illustrated here as ORXCOMPOUT.

Receive termination 802 may include a plurality of parallel resistor legs 806, each including a resistor 808 and a switch 810, illustrated here as NMOS devices. NMOS devices 810 may be controlled by receive termination compensation code 830, which may be implemented, for example, as a 7-bit code. Receive termination compensation code 830 may correspond to compensation 212 in FIG. 2.

Resistor legs 806 may be configured in a binary fashion, such as described above with respect to FIG. 3, and receive termination compensation code 830 may be a binary code.

Receive termination 804 may be configured similar to receive termination 802.

Calibration logic 216 may be configured to calibrate receive terminations 802 and 804 to each have a resistance of calibrated on-die resistor 214, and to perform the calibration at an operating voltage encountered by receive terminations 802 and 804 during normal operation. A normal operating voltage by may be, for example, approximately $V_{CC}/4$.

Calibration system 210 may be configured to couple receive terminations 802 and 804 and $R_{EXT}$ 218 in parallel with one another during calibration of receive terminations 802 and 804.

Calibration logic 216 may be configured to adjust receive termination compensation code 830 to selectively open and close NMOS devices 810 until a voltage at a node 812 is substantially equal to $V_{REF2}$, which may be, for example, approximately $V_{CC}/4$. Calibration logic 216 may be configured to adjust receive termination compensation code 830 in response to an output 836 of comparator $232_0$, illustrated in FIG. 8 as INCURCOUNTUP.

Where calibrated on-die resistor 214 and external resistor $R_{EXT}$ 218 are substantially equal to one another, receive terminations 802 and 804 are each calibrated to the resistance of calibrated on-die resistor 214 when the voltage at node 812=$V_{REF2}$=$V_{CC}$/4. This is illustrated in the following equation:

$$V_{NODE\_812} = \frac{(50/3)}{(50 + 50/3)} * V_{CC} = 0.250 * V_{CC}$$

The use of calibrated on-die resistor 214 and an operating environment voltage, such as $V_{CC}$/4, may help to avoid introducing voltage dependent resistance variation on switches of receive terminations 802 and 804 that may otherwise arise, such where calibration is performed using only external resistors and a reference voltage that does not correspond to an operating voltage of receive terminations 802 and 804.

Where multiple on-die resistors are used during calibration, a change in on-die resistance, such as due to process, voltage, and/or temperature changes, may affect substantially all on-die resistors substantially similarly, and any error may be divided amongst the on-die resistors.

Figure 9:
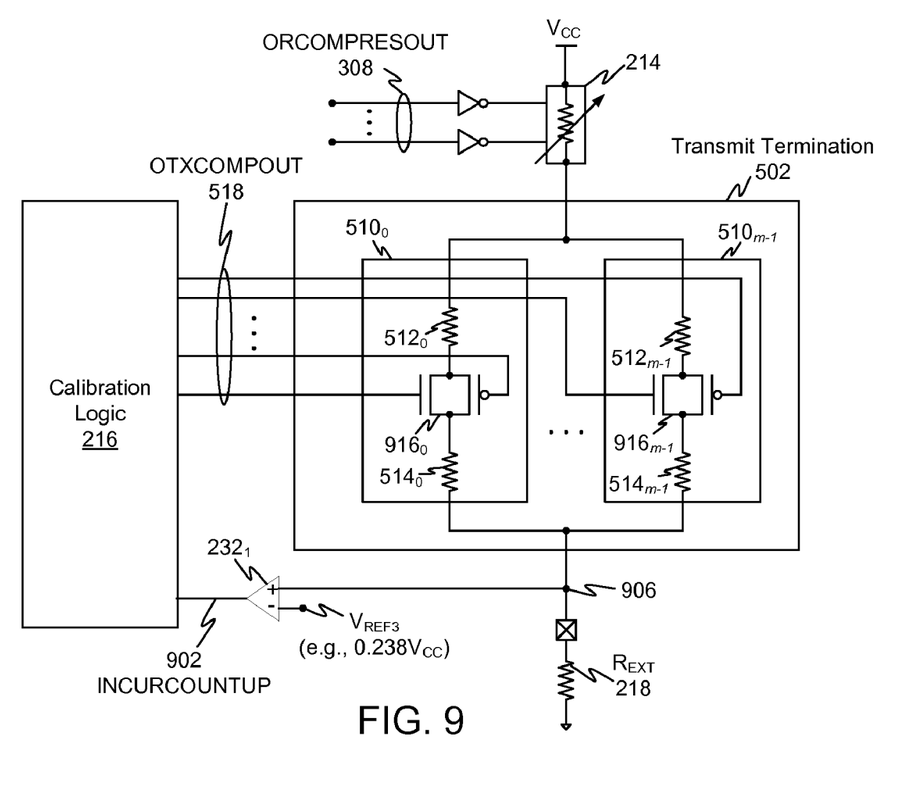
FIG. 9 is an exemplary circuit diagram of the transmit termination and portions of the calibration system to calibrate the transmit termination relative to the adjustable on-die resistor.

FIG. 9 is an exemplary circuit diagram of differential transmit termination 502 and portions of calibration system 210 to determine transmit termination compensation code 518. In FIG. 9, switches 516 of FIG. 5 are illustrated as differential NMOS and PMOS devices 916. An output of a comparator $232_1$ is illustrated as INCURCOUNTUP 902.

In the example of FIG. 9, differential transmit termination 502 is coupled in series between calibrated on-die resistor 214 and external resistor $R_{EXT}$ 218.

Calibration logic 216 may be configured to adjust transmit termination compensation code 518 to selectively open and close devices 916 until a voltage at a node 906 is substantially equal to $V_{REF3}$.

Calibration logic 216 may be configured to use calibrated on-die resistor 214 to calibrate differential transmit termination 502 to have a resistance of, for example, 110 ohms, and to perform the calibration at a operating environment voltage of transmit termination 502.

Where calibrated on-die resistor 214 and external resistor $R_{EXT}$ 218 are substantially equal to 50 ohms, differential transmit termination 502 will be calibrated to a resistance of 110 ohms when the voltage at node 906 is equal to 0.238$V_{CC}$. This is illustrated the following equation:

$$V_{NODE\_906} = \frac{50}{(50 + 110 + 50)} * V_{CC} = 0.238 * V_{CC}$$

Calibration system 210 may be configured to use calibrated on-die resistor 214 to calibrate a simulated far-end differential receive termination, such as described above with respect to 110 in FIG. 1, and to calibrate current drivers PBias 506 and NBias 508 of FIG. 5 using the calibrated far-end receive termination in parallel with the calibrated transmit termination 502, such as described below with respect to FIG. 10.

The simulated far-end receive termination may be configured similar to transmit termination 502. The simulated far-end receive termination may be calibrated to a resistance as seen by push-pull driver 206 during operation, and at an operating voltage of push-pull driver 206. The resistance to which, and/or voltage at which the simulated far-end receive termination is calibrated may be substantially equal to, or may differ from those of transmit termination 502. The simulated far-end receive termination may be calibrated, for example, to 100 ohms.

Calibration system 210 may be configured to simultaneously calibrate driver currents and voltage swing of push-pull driver 206, such as described below with respect to FIG. 10.

Figure 10:
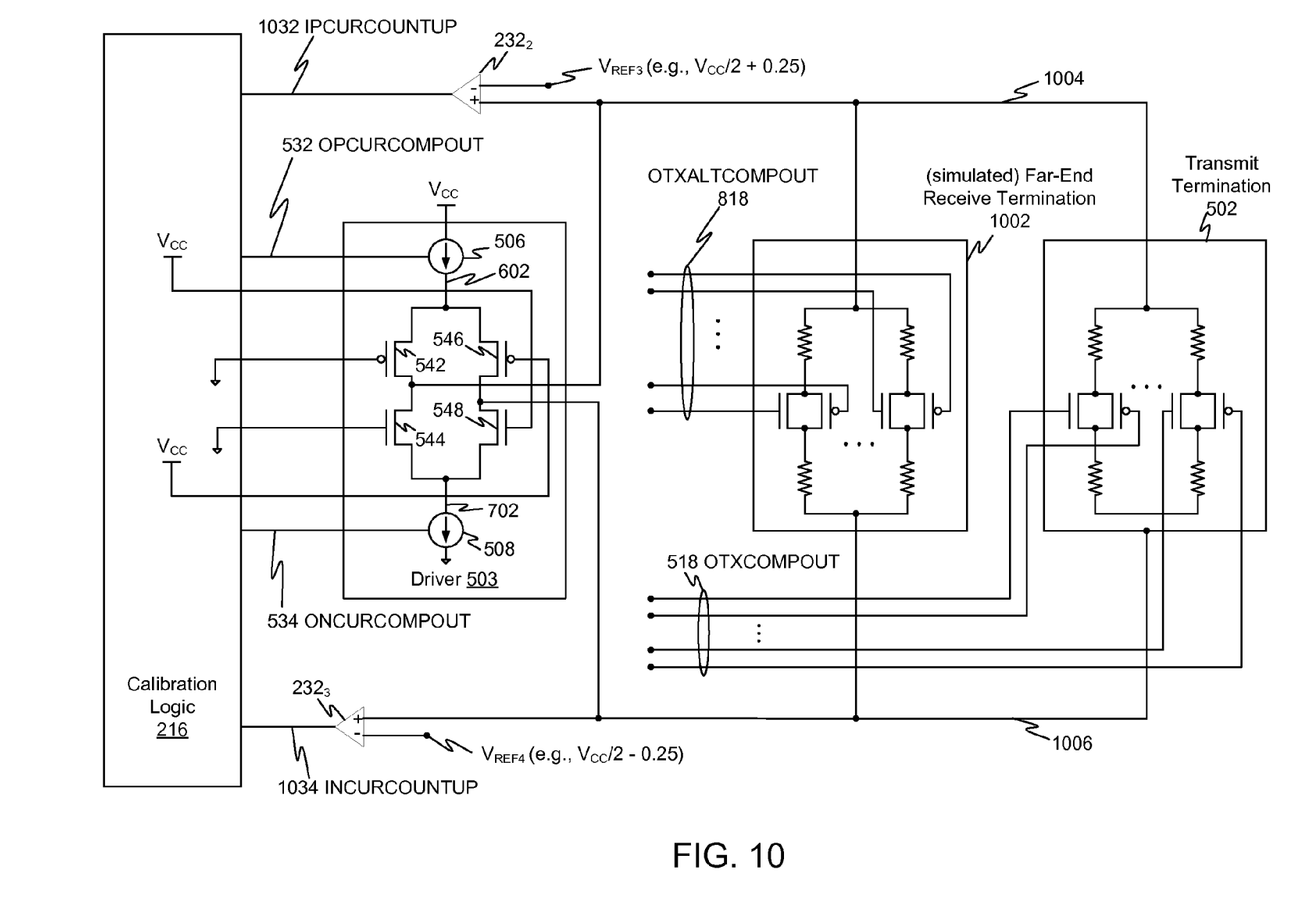
FIG. 10 is an exemplary circuit diagram of the transmit termination, a far-end receive termination, and portions of the calibration system to calibrate the current drivers and voltage swing relative to the transmit termination and the far-end receive termination.

FIG. 10 is an exemplary circuit diagram of differential driver 503, transmit termination 502 coupled in parallel with a simulated far-end receive termination 1002, and portions of calibration system 200 to determine current driver compensation codes 532 and 534.

Calibration logic 216 may be configured to adjust current driver compensation codes 532 and 534 to adjust driver currents 602 and 702, respectively, to obtain a desired current through, and a desired voltage swing across transmit termination circuitry 502 and simulated far-end receive termination 1002.

Calibration logic 216 may be configured to adjust current driver compensation codes 532 and 534 in response to voltages at nodes 1004 and 1006, and may be configured to adjust current driver compensation codes 532 and 534 in response to difference values 1032 and 1034, corresponding to differences between the voltages at nodes 1004 and 1006, and corresponding reference voltages $V_{REF3}$ and $V_{REF4}$.

Comparators $232_2$ and $232_3$ may be configured to output corresponding difference values 1032 and 1034 as a logic value 1 when the node voltage is greater than the reference voltage, and as a logic value 0 when the node voltage is less than the reference voltage.

Calibration logic 216 may be configured to adjust current driver compensation codes 532 and 534, individually and/or simultaneously, in response to a combination of difference values 1032 and 1034, such as described below with respect to Tables 3 and 4.

Reference voltages $V_{REF3}$ and $V_{REF4}$ may correspond to operating environment voltages of push-pull driver 206, which may be, for example, approximately equal to $V_{CC}$/2+ 0.25 and $V_{CC}$/2−0.25, respectively, or a voltage swing voltage of 0.5 volts.

Where transmit termination 502 and simulated far-end receive termination 1002 are calibrated to 110 ohms and 100 ohms, respectively, current drivers PBias 506 and NBias 508 may be adjusted to provide current of approximately 9.545 milliamps (mA) through the parallel combination of transmit termination 502 and simulated far-end receive termination 1002, such that the voltage drop between nodes 1004 and 1006 is equal to:

$$9.545 \text{ mA} * (100 \text{ ohms} || 110 \text{ ohms}) = 9.545 \text{ mA} * \frac{(100)(110)}{(100 + 110)} = 0.5 \text{ V}$$

Use of simulated far-end receive termination 1002 may help to calibrate current drivers 506 and 506 relative to an operating environment of push-pull driver 206.

Calibration logic 216 may include logic to perform a relatively coarse calibration and logic to perform a relative fine tuning calibration. Selection between a coarse tuning and a fine tuning may depend upon a transmit voltage swing measurement. Coarse tuning may include simultaneously adjusting currents 602 and 702 during a given iteration. Fine tuning may include adjusting one of currents 602 and 702 during a given iteration.

Calibration logic 216 may include one or more tables, which may be implemented with finite state machine logic, to calibrate driver currents and voltage swing of push-pull driver 206, such as illustrated in Tables 3 and 4. Table 3 illustrates an exemplary coarse tuning table. Table 4 illustrates an exemplary fine tuning table.

TABLE 3

| IPCURCOUNTUP 1032 | INCURCOUNTUP 1034 | OPCURCOMPOUT Code 532 | ONCURCOMPOUT Code 534 | NOTE |
|---|---|---|---|---|
| 0 | 0 | Increment | Decrement | Low VCM |
| 0 | 1 | Increment | Increment | Low V Swing |
| 1 | 0 | Decrement | Decrement | V Swing is High |
| 1 | 1 | Decrement | Increment | VCM is High |

TABLE 4

| IPCURCOUNTUP 1032 | INCURCOUNTUP 1034 | OPCURCOMPOUT Code 532 | ONCURCOMPOUT Code 534 | NOTE |
|---|---|---|---|---|
| 0 | 0 | Increment | No Change | VCM is Low |
| 0 | 1 | No Change | Increment | V Swing is Low |
| 1 | 0 | No Change | Decrement | V Swing is High |
| 1 | 1 | Decrement | No Change | VCM is High |

Coarse tuning and fine tuning may each include a number of iterative cycles. Coarse tuning may include more iterations than fine tuning, and may include, for example, twice as many cycles as fine tuning Coarse tuning may include, for example, 32 cycles, and fine tuning may include, for example, 16 cycles.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
  a push-pull driver, including a receive termination, a differential transmit termination, and current drivers;
  an adjustable calibration resistor; and
  a calibration system to calibrate the adjustable calibration resistor relative to a second resistor at a voltage within an operating voltage range of the push-pull driver, and to calibrate the push-pull driver relative to the adjustable calibration resistor at a voltage within the operating voltage range of the push-pull driver, including to calibrate the receive termination and the differential transmit termination relative to the adjustable calibration resistor, and to calibrate the current drivers relative to the differential transmit termination;
  wherein the push-pull driver and the adjustable calibration resistor are implemented on an integrated circuit die.

2. The system of claim 1, wherein the calibration system is implemented to calibrate a simulated far-end differential receive termination relative to the adjustable calibration resistor, and to calibrate the current drivers relative to the differential transmit termination and the simulated far-end differential receive termination coupled in parallel with one another.

3. The system of claim 1, wherein the calibration system is further implemented to compare first and second swing voltages of the push-pull driver to corresponding first and second reference voltages, and to simultaneously adjust first and second current drivers in response to the comparisons.

4. The system of claim 3, wherein the calibration system is further implemented to generate binary outputs in response the comparisons and to simultaneously adjust compensation code values associated with the first and second current drivers in response to the binary outputs and under control of finite state machine logic.

5. The system of claim 3, wherein the calibration system is further implemented to iteratively repeat the simultaneous adjustments, and to subsequently compare the first and second swing voltages to the corresponding first and second reference voltages and adjust the first and second current drivers individually in response to the subsequent comparisons.

6. The system of claim 1, wherein:
  the adjustable calibration resistor includes a plurality of parallel selectable resistor legs, each resistor leg having a resistance of approximately twice the resistance of a preceding resistor leg; and
  the calibration system is implemented to adjust a binary code to enable selected ones of the resistor legs.

7. A method, comprising:
  calibrating an adjustable calibration resistor relative to a second resistor at a voltage within an operating voltage range of a push-pull driver; and
  calibrating the push-pull driver relative to the adjustable calibration resistor at a voltage within the operating voltage range of the push-pull driver, including calibrating a receive termination and a differential transmit termination of the push-pull driver relative to the adjustable calibration resistor, and calibrating drive currents of the push-pull driver relative to the differential transmit termination;

wherein the adjustable calibration resistor and the push-pull driver are implemented on an integrated circuit die.

8. The method claim 7, wherein:

the calibrating of the push-pull driver further includes calibrating a simulated far-end receive termination relative to the adjustable calibration resistor; and the calibrating drive currents includes calibrating drive currents relative to the differential transmit termination and the simulated far-end differential receive termination in parallel with one another.

9. The method claim 8, further including:

recalibrating at least a portion of the push-pull driver relative to the adjustable calibration resistor from within the integrated circuit die between transmission operations of the push-pull driver.

10. The method of claim 7, wherein the calibrating drive currents includes:

comparing first and second swing voltages of the push-pull driver to corresponding first and second reference voltages; and simultaneously adjusting first and second current drivers in response to the comparing.

11. The method of claim 10, wherein the calibrating drive currents further includes:

generating binary outputs in response the comparing; and simultaneously adjusting compensation code values associated with the first and second current drivers in response to the binary outputs and under control of finite state machine logic.

12. The method claim 7, wherein the adjustable calibration resistor includes a plurality of parallel selectable resistor legs, each resistor leg having a resistance of approximately twice the resistance of a preceding resistor leg, and wherein the calibrating of the adjustable calibration resistor includes:

adjusting a binary code to enable selected ones of the resistor legs.

13. The method of claim 7, wherein the calibrating of the adjustable calibration resistor includes:

coupling the adjustable calibration resistor in series with the second resistor;

applying a system voltage to the adjustable calibration resistor; and adjusting the adjustable calibration resistor until a voltage drop across the adjustable calibration resistor is approximately equal to one half of the system voltage.

14. The method of claim 13, wherein the calibrating of the push-pull driver further includes:

coupling receive terminations of the push-pull driver and the second resistor in parallel with one another;

coupling the adjustable calibration resistor in series with the parallel combination of the receive terminations and the second resistor;

applying the system voltage to the adjustable calibration resistor; and adjusting the receive terminations until a voltage drop across the parallel combination of the receive terminations and the second resistor is approximately equal to one quarter of the system voltage.

15. The method of claim 13, wherein the calibrating of the push-pull driver further includes:

coupling a differential transmit termination of the push-pull driver in series between the adjustable calibration resistor and the second resistor;

applying the system voltage to the adjustable calibration resistor;

adjusting the differential transmit termination until a voltage drop across the differential transmit termination corresponds to a desired resistance of the differential transmit termination;

coupling a simulated far-end differential receive termination in series between the adjustable calibration resistor and the second resistor;

applying the system voltage to the adjustable calibration resistor;

adjusting the simulated far-end differential receive termination until a voltage drop across the simulated far-end differential receive termination corresponds to a resistance of a far-end differential receive termination;

coupling the differential transmit termination and the simulated far-end differential receive termination in parallel with one another and to the current drivers; and adjusting the current drivers until voltages at differential nodes of the differential transmit termination correspond to approximately one half of the system voltage plus and minus corresponding swing voltages.

16. A system, comprising:

a push-pull driver;

an adjustable calibration resistor; and a calibration system to calibrate the adjustable calibration resistor relative to a second resistor at a voltage within an operating voltage range of the push-pull driver, and to calibrate the push-pull driver relative to the adjustable calibration resistor at a voltage within the operating voltage range of the push-pull driver;

wherein the calibration system is implemented to couple the adjustable calibration resistor in series with the second resistor, to apply a system voltage of the push-pull driver to the adjustable calibration resistor, and to adjust the adjustable calibration resistor until a voltage drop across the adjustable calibration resistor is approximately equal to half of the system voltage; and wherein the push-pull driver and the adjustable calibration resistor are implemented on an integrated circuit die.

17. The system of claim 16, wherein:

the push-pull driver includes receive terminations; and the calibration system is implemented to couple the receive terminations and the second resistor in parallel with one another, to couple the parallel combination of the receive terminations and the second resistor in series between the adjustable calibration resistor and the second resistor, to apply to system voltage to the adjustable calibration resistor, and to adjust the receive terminations until a voltage drop across the parallel combination of the receive terminations and the second resistor is approximately equal to one quarter of the system voltage.

18. The system of claim 16, wherein:

the push-pull driver includes a differential transmit termination and current drivers;

the calibration system is implemented to couple the differential transmit termination in series between the adjustable calibration resistor and the second resistor, apply the system voltage to the adjustable calibration resistor, and adjust the differential transmit termination until a voltage drop across the differential transmit termination corresponds to a desired resistance of the differential transmit termination;

the calibration system is further implemented to couple a simulated far-end differential receive termination in series between the adjustable calibration resistor and the second resistor, apply the system voltage to the adjustable calibration resistor, and adjust the simulated far-end differential receive termination until a voltage drop across the simulated far-end differential receive termination corresponds to a resistance of a far-end differential receive termination; and the calibration system is further implemented to couple the differential transmit termination and the simulated far-end differential receive termination in parallel with one another and to the current drivers, and to adjust the current drivers until voltages at differential nodes of the differential transmit termination correspond to approximately one half of the system voltage plus and minus swing voltages of the push-pull driver.

* * * * *